(12) United States Patent
Puri et al.

(10) Patent No.: US 6,302,700 B1
(45) Date of Patent: *Oct. 16, 2001

(54) CIRCUIT BOARD WITH CONNECTOR GUIDE

(75) Inventors: Surrinder S. Puri, Schaumburg; John P. Dorth, Downers Grove; Marc E. Krause, Darien, all of IL (US)

(73) Assignee: Tellabs Operations, Inc., Lisle, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/393,243

(22) Filed: Sep. 10, 1999

(51) Int. Cl.[7] ................................................ H01R 12/00
(52) U.S. Cl. ................................ 439/59; 439/633
(58) Field of Search ........................... 439/59, 325, 630, 439/633, 636, 637, 951

(56) References Cited

U.S. PATENT DOCUMENTS

| | | | | |
|---|---|---|---|---|
| 3,396,461 | * | 8/1968 | Spooner et al. | 439/951 |
| 5,041,023 | * | 8/1991 | Lytle | 439/637 |
| 5,184,961 | * | 2/1993 | Ramirez et al. | 439/59 |
| 5,277,611 | * | 1/1994 | Berek et al. | 439/59 |
| 5,319,523 | * | 6/1994 | Ganthier et al. | 439/951 |
| 5,387,132 | * | 2/1995 | Sarver et al. | 439/633 |
| 5,740,020 | * | 4/1998 | Palatov | 439/59 |

* cited by examiner

Primary Examiner—Tulsidas Patel

(57) ABSTRACT

A circuit board defining a flange is used to interconnect conductors located on the flange with corresponding conductors of a conventional connector. The flange includes a key slot and two flange slots which promote alignment between the circuit board and the connector. The flange slots define a mouth with an angled edge which urge the connector into alignment with the flange slots.

7 Claims, 5 Drawing Sheets

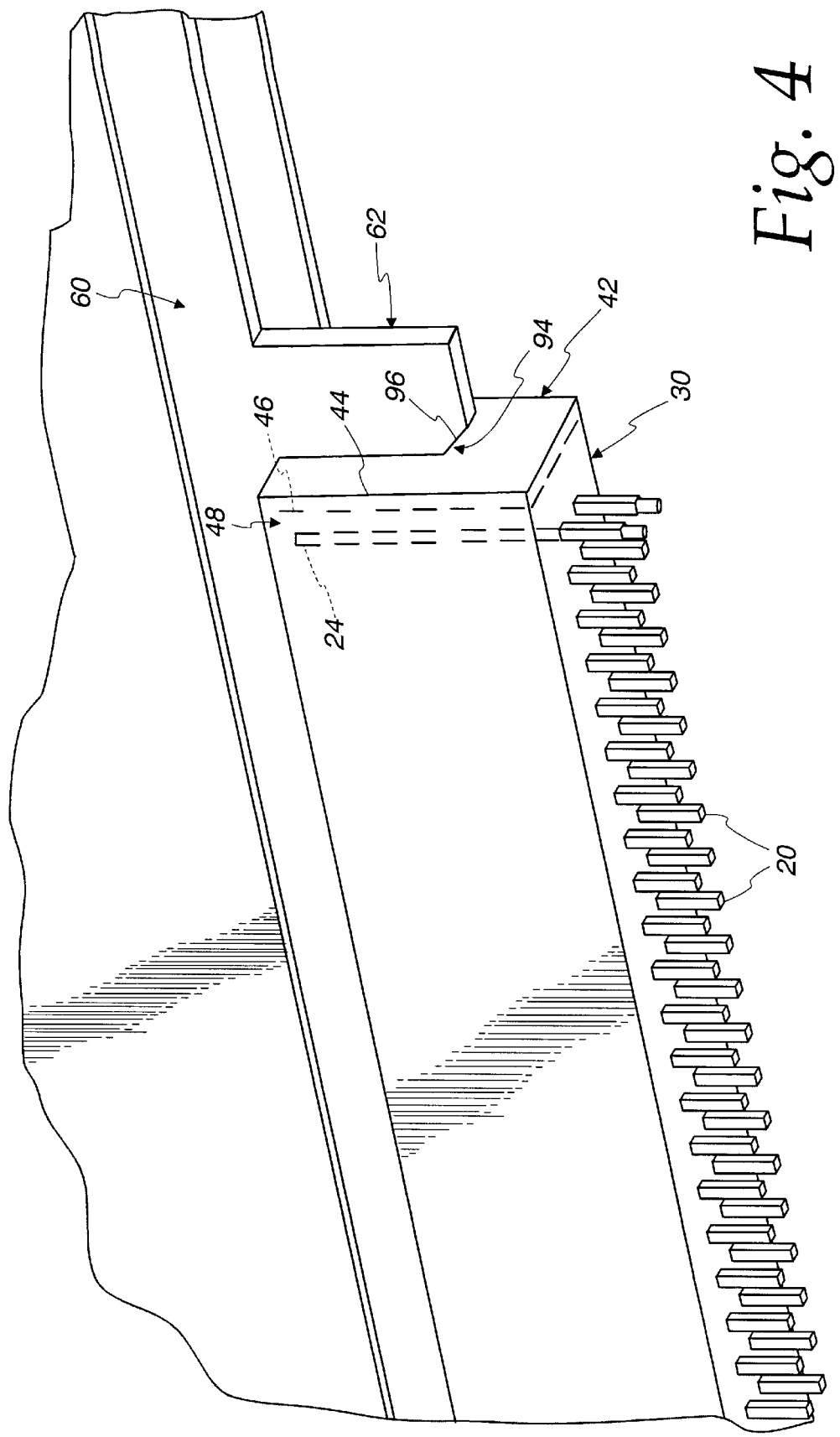

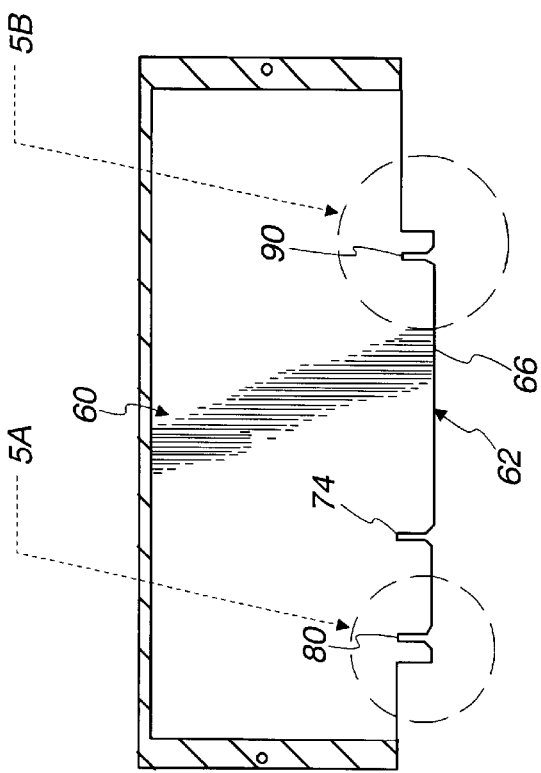
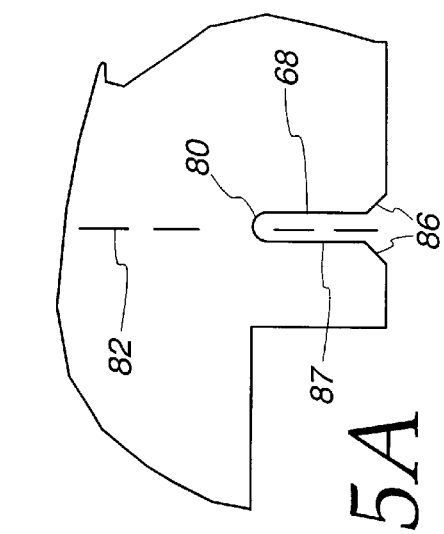

CIRCUIT BOARD WITH CONNECTOR GUIDE

BACKGROUND OF THE INVENTION

This invention relates to electrical circuit boards, and more particularly relates to guides for engaging such boards with connectors.

Experience has shown that it is frequently difficult during assembly to properly engage the conductors in a conventional 88-pin connector with corresponding conductors located on a circuit board. Unless the connector is very precisely positioned with respect to the circuit board, the conductors of the connector may overlap the conductors of the board, thereby causing a short circuit and failure of the components connected on the board. The present invention solves that problem by guiding the alignment of the conductors in the connector with respect to the conductors on the circuit board.

BRIEF SUMMARY OF THE INVENTION

The present invention is useful for facilitating the connection of a circuit board comprising a plurality of first conductors with a connector comprising a plurality of second conductors defining a first conductor end and a second conductor end. The connector also comprises a body defining a first end portion having an outer edge and also having an inner edge displaced from the first conductor by a first gap and defining a second end portion having an outer edge and also having an inner edge displaced from the second conductor end by a second gap.

The board preferably comprises a flange extending from the board and arranged to fit between the inner edge of the first end portion and the inner edge of the second end portion. The flange carries the first conductors adjacent a flange front edge. The flange also defines a flange first edge suitable for entry into the first gap and defines a flange second edge suitable for entry into the second gap.

By using the foregoing arrangement, the second conductors may be guided into engagement with the first conductors with a degree of ease and accuracy unattained by the known prior art.

BRIEF DESCRIPTION OF THE DRAWINGS

FIG. 4 is an enlarged, perspective view of the right portion of the apparatus as viewed in FIG. 1.

FIG. 5 is a top plan view of the circuit board shown in FIG. 1 with the connector and cartridge removed.

FIG. 5A is an enlargement of a portion of FIG. 5 indicated by detail 5A.

FIG. 5B is an enlargement of a portion of FIG. 5 indicated by detail 5B

DESCRIPTION OF THE PREFERRED EMBODIMENT

Figure 1:
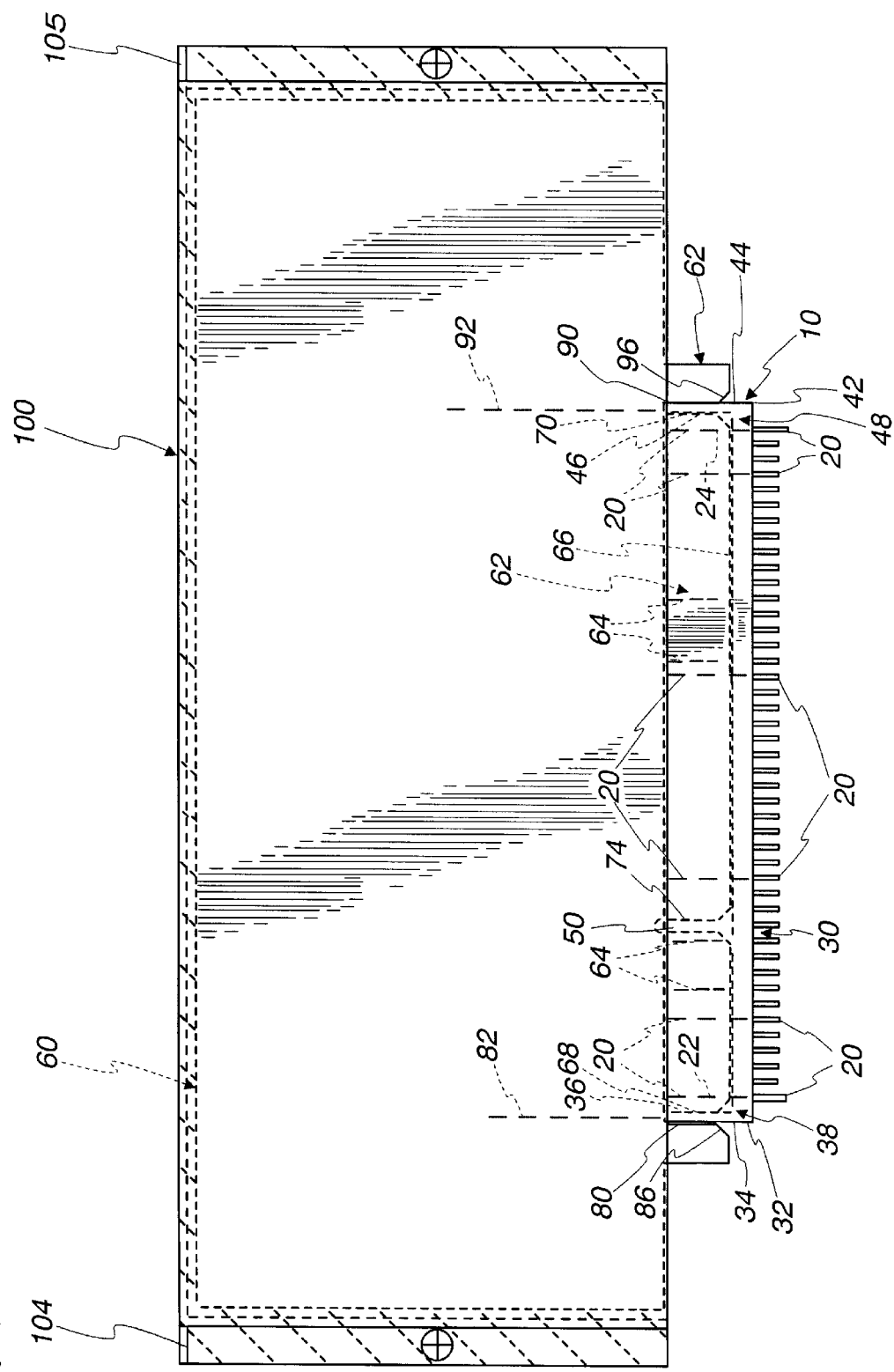
FIG. 1 is a top plan view of a conventional connector engaged with a preferred form of the invention held in a cartridge.
Figure 2:
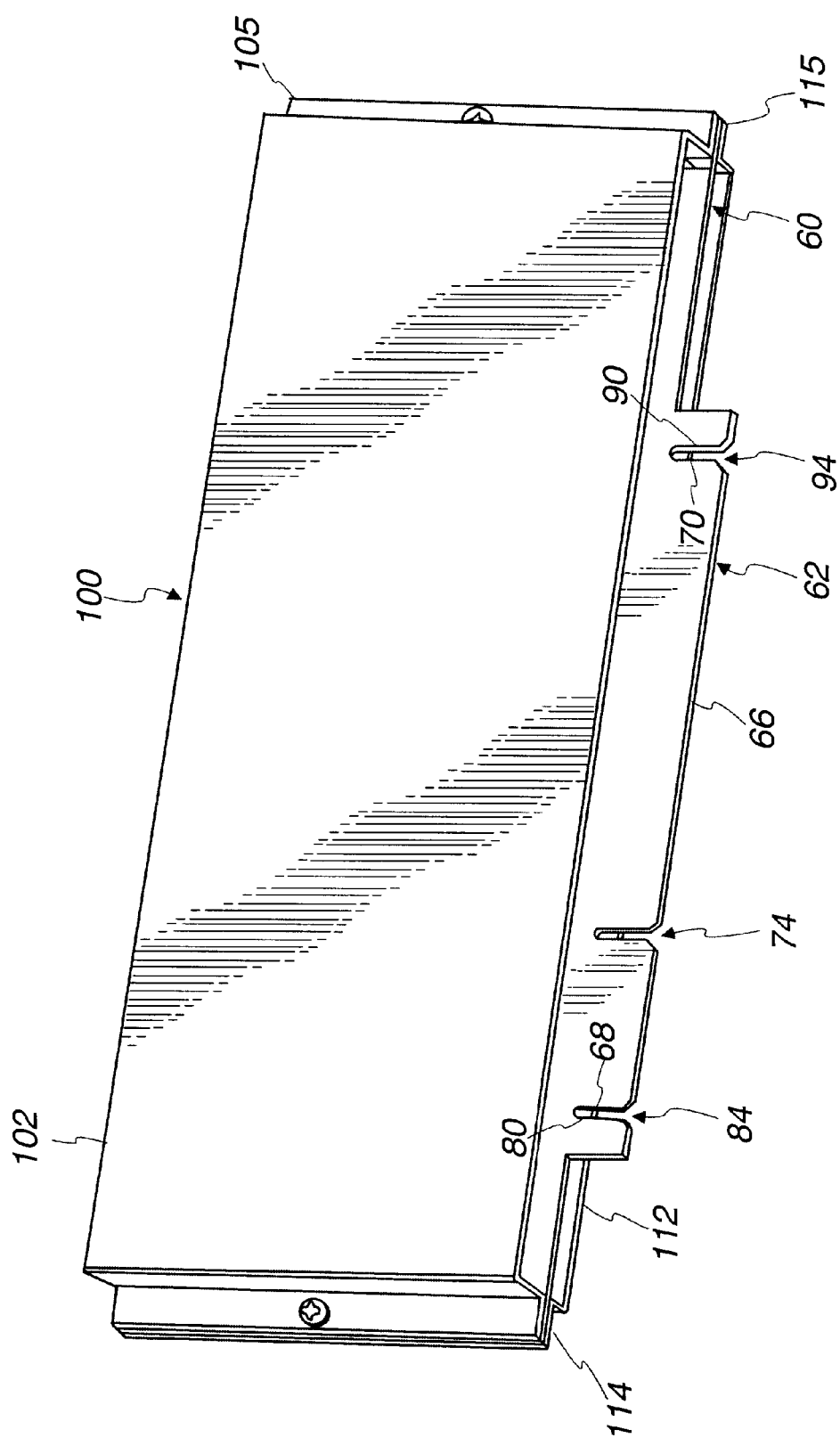
FIG. 2 is a perspective view of the apparatus shown in FIG. 1 with the connector removed.
Figure 3:
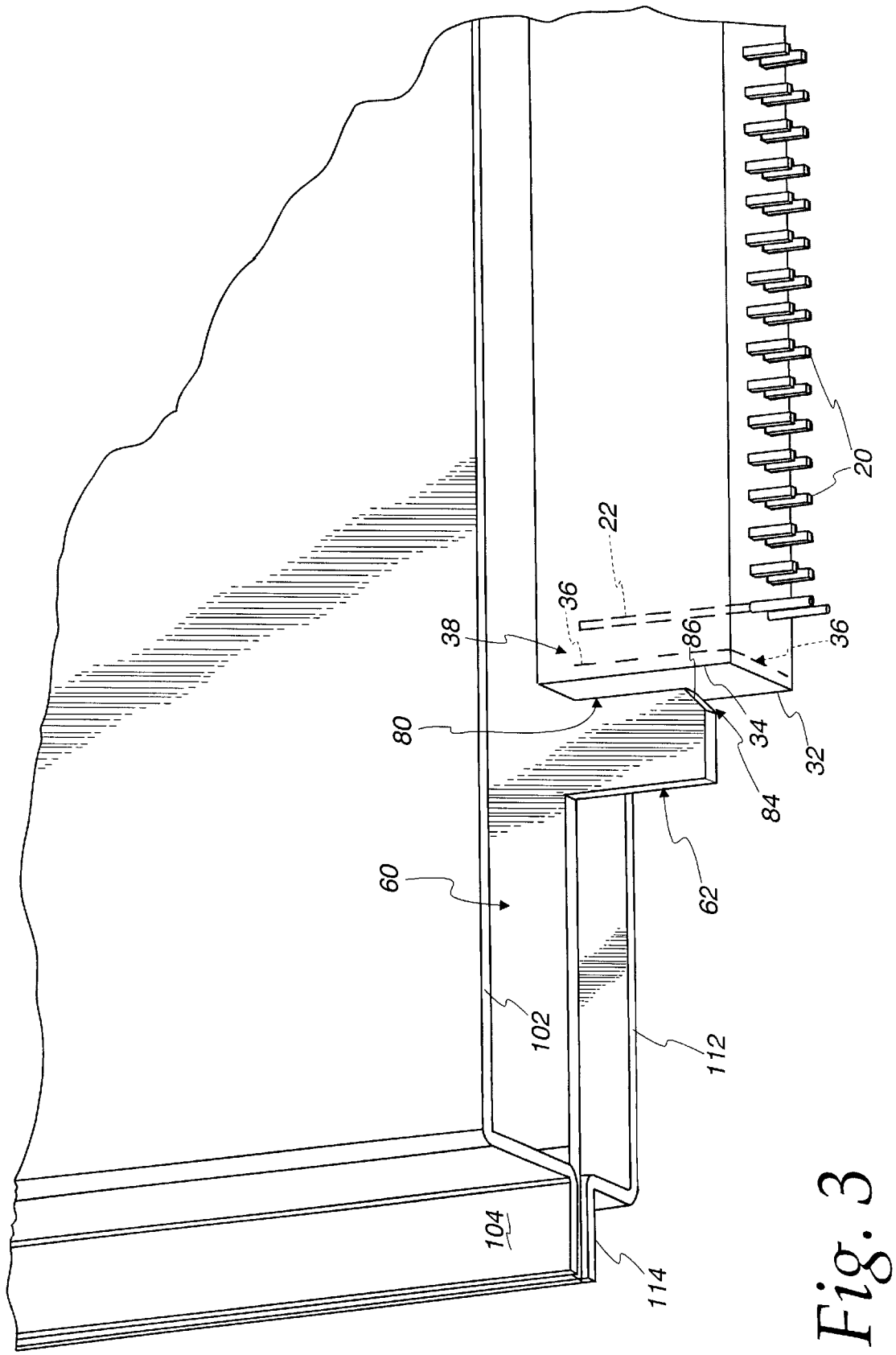
FIG. 3 is an enlarged, perspective view of the left portion of the apparatus as viewed in FIG. 1.

Referring to Figures, the invention is useful in connection with a standard connector 10 having a plurality of conductors 20 defining a conductor end 22 and an opposing conductor end 24. Connector 10 may in practice comprise a standard 88-pin connector.

Connector 10 also comprises a body 30, including an end portion 32 defining an outer edge 34 and an inner edge 36. Conductor end 22 is separated from inner edge 36 by a gap 38.

Body 30 also comprises an end portion 42 defining an outer edge 44 and an inner edge 46. Conductor end 24 is displaced from inner edge 46 by a gap 48.

Body 30 also comprises a key 50 adapted to be inserted into a slot.

An electrical circuit board 60 comprises a flange 62 which fits between the conductors of connector 10 and also fits between inner edges 36 and 46 of connector 10.

The circuit board includes conductors 64 which are constructed for electrical and physical engagement with the corresponding conductors 20 of connector 10. In practice, there may be one of conductors 64 for each of conductors 20. Conductors 64 are carried by board 60 adjacent a front edge 66 of flange 62. Flange 62 also defines an edge 68 suitable for entry into gap 38 and another edge 70 suitable for entry into gap 48. Edges 68 and 70 are perpendicular to front edge 66.

Flange 62 defines a key slot 74 which is adapted to a co-mate with key 50 of connector 10.

Flange 62 defines a flange slot 80 which further defines an axis 82 and a mouth 84 with edges 86 angled at 45° with respect to axis 82. Slot 80 also defines an edge 87 parallel to edge 68 and axis 82. The distance between outer edge 34 and inner edge 36 is at least ¾ of the width of flange slot 80. The width of slot 80 is the distance between edges 87 and 68. Edge 68 defines the inner edge of slot 80.

Flange 62 also defines a flange slot 90 which further defines an axis 92 and a mouth 94 with edges 96 angled at 45° with respect to axis 92. Slot 90 also defines an edge 97 parallel to edge 70 and axis 92. The distance between outer edge 44 and inner edge 46 is at least ¾ the width of flange slot 90. The width of slot 90 is the distance between edges 70 and 97. Axes 82 and 92 are perpendicular to front edge 66 of flange 62. Key slot 74 is also perpendicular to front edge 66. Edge 70 defines the inner edge of slot 90.

Circuit board 60 may be housed in a conventional cartridge 100 comprising a top cover 102 integrally formed with flanges 104 and 105 and a bottom cover 112 integrally formed with flanges 114 and 115. Flange 104 may be connected to flange 114 by a conventional screw, and flange 105 may be connected to flange 115 by a conventional screw.

In order to use the invention, connector 10 is manually placed adjacent flange 62 so that key slot 74 is aligned with key 50, end portion 32 is aligned with flange slot 80, and end portion 42 is aligned with flange slot 90. Mouths 84 and 94, together with edges 86 and 96, help guide and urge end portions 32 and 42 into flange slots 80 and 90, respectively. The arrangement of the key slot and flange slots properly align conductors 20 with conductors 64 so that the flange 62 smoothly slides onto the connector and proper physical and electrical contact between corresponding pins 20 and 64 is assured.

Those skilled in the art will recognize that the preferred embodiment may be modified and altered without departing from the true spirit and scope of the invention as defined in the accompanying claims.

What is claimed is:

1. Apparatus comprising a circuit board including a plurality of first conductors and a connector including a plurality of second conductors, said second conductors defining a first conductor end and a second conductor end, said connector comprising a body defining a first end portion having an outer edge and also having an inner edge spaced from the first conductor end by a first gap and defining a second end portion having an outer edge and also having an inner edge spaced from the second conductor end by a second gap, the first and second gaps being devoid of a key, said circuit board comprising a flange extending from the board, said flange defining a first flange slot adapted to receive the first end portion of the connector and defining a second flange slot adapted to receive the second end portion of the connector, said first flange slot defining a first mouth wider than the width of the first flange slot and said second flange slot defining a second mouth wider than the width of the second flange slot, the first and second mouths each defining mouth edges of substantially equal length, said flange carrying the first conductors adjacent a flange front edge, defining a flange first edge suitable for entry into the first gap and defining a flange second edge suitable for entry into the second gap, whereby the second conductors may be guided into engagement with the first conductors.

2. The apparatus as claimed in claim 1 wherein the flange first edge and the flange second edge are perpendicular to the flange front edge.

3. The apparatus as claimed in claim 1 wherein the flange defines a key slot and wherein the connector defines a key adapted to be inserted into the key slot.

4. The apparatus as claimed in claim 3 wherein the key slot is located between the flange first edge and the flange second edge.

5. The apparatus, as claimed in claim 1, wherein the distance between the inner edge and the outer edge of the first end portion of the connector is at least ¾ of the width of the first flange slot.

6. The apparatus, as claimed in claim 5, wherein the distance between the inner edge and the outer edge of the second end portion of the connector is at least ¾ of the width of the second flange slot.

7. The apparatus as claimed in claim 1, wherein the first flange slot defines a first axis perpendicular to flange front edge, wherein the second flange slot defines a second axis perpendicular to flange front edge, wherein the first mouth defines a first mouth edge angled at about 45 degrees with respect to the first axis and wherein the second mouth defines a second mouth edge angled at about 45 degrees with respect to the second axis.

\* \* \* \* \*